(12) United States Patent
Lee et al.

(10) Patent No.: US 7,883,240 B2
(45) Date of Patent: Feb. 8, 2011

(54) LIGHT EMITTING DIODE BASED LIGHT SOURCE ASSEMBLY

(75) Inventors: Pei-Chin Lee, Miao-Li Hsien (TW); Chih-Wei Lin, Miao-Li Hsien (TW); Hung-Kuang Hsu, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 521 days.

(21) Appl. No.: 11/967,034

(22) Filed: Dec. 29, 2007

(65) Prior Publication Data

US 2009/0097249 A1    Apr. 16, 2009

(30) Foreign Application Priority Data

Oct. 16, 2007   (CN) .................. 2007 1 0202072

(51) Int. Cl.
 *F21S 4/00* (2006.01)
(52) U.S. Cl. .................. 362/249.02; 362/294; 362/373; 362/390
(58) Field of Classification Search ............ 362/249.02, 362/294, 373, 390
See application file for complete search history.

(56) References Cited

U.S. PATENT DOCUMENTS

| | | | |
|---|---|---|---|
| 6,998,650 B1 * | 2/2006 | Wu | 257/100 |
| 2003/0075725 A1 * | 4/2003 | Panajotov et al. | 257/99 |
| 2005/0213328 A1 * | 9/2005 | Matheson | 362/267 |
| 2006/0061997 A1 | 3/2006 | Lin | |
| 2006/0169991 A1 * | 8/2006 | Kikuchi | 257/81 |
| 2006/0187660 A1 * | 8/2006 | Liu | 362/294 |
| 2006/0202850 A1 | 9/2006 | Hefright et al. | |

FOREIGN PATENT DOCUMENTS

| | | |
|---|---|---|
| CN | 200420006136.5 | 3/2005 |
| CN | 1862085 A | 11/2006 |
| JP | 2001289226 A * | 10/2001 |

OTHER PUBLICATIONS

Atsushi Okuno et al., Unique White LED Packaging Systems, 2003 IEEE Electronic Components and Technology Conference.

* cited by examiner

*Primary Examiner*—Sandra L O Shea
*Assistant Examiner*—Mary Zettl
(74) *Attorney, Agent, or Firm*—Jeffrey T. Knapp

(57) ABSTRACT

An LED based light source assembly (10) comprises a circuit board (11), a plurality of LEDs (13), a heat sink (15) and a plurality of fasteners (17). The circuit board comprises a first surface (12) and a second surface (14) opposite to the first surface. The first surface is provided with electrical conductive traces (118). The plurality of LEDs are arranged on the first surface of the circuit board and electrically connecting with the electrical wires of the circuit board. The heat sink thermally contacts the second surface of the circuit board. The plurality of fasteners each comprise a first end (172) and a second end (174) opposite to the first end. The first end of each of the fasteners abuts on the first surface of the circuit board. The second end of each of the fasteners extends through the circuit board to be secured to the heat sink.

19 Claims, 9 Drawing Sheets

LIGHT EMITTING DIODE BASED LIGHT SOURCE ASSEMBLY

BACKGROUND OF THE INVENTION

1. Field of the Invention

The present invention relates to a light source assembly employing light emitting diode, and more particularly to a light emitting diode based light source assembly having a heat sink for effectively dissipating heat.

2. Description of Related Art

Light emitting diode (LED) has many advantages, such as high luminance brightness, low power consumption, good matching with integrated circuit, long-term reliability and environment friendliness so that the LED has been widely used as backlight source in liquid crystal display (LCD) as described in an article entitled "Unique White LED Packaging Systems" cited in a publication of 2003 IEEE Electronic Components and Technology Conference written by Atsushi Okuno.

An LED device generally comprises a plurality of LEDs arranged side-by-side in a large density and generates a lot of heat in operation so that temperature of the LEDs gets very high. It is well known that the LED is a semiconductor device which is sensitive to temperature. Generally speaking, high temperature results in greatly reducing service life of the LEDs. Furthermore, high temperature also has a reducing effect on resistance of the LEDs so that electrical current through the LEDs becomes larger and more heat is generated and accumulates in the LEDs. Thus, a working condition for the LED device becomes worse and worse.

In a related art disclosed in U.S. Pat. No. 6,428,189 B1, an LED light source assembly includes a plurality of LEDs and a heat dissipater used to absorb heat accumulated in the LEDs. The LEDs electrically connect with a circuit board, and further extend through the circuit board to thermally contact the heat dissipater via a thermal coupling agent. However, the thermal coupling agent can not make a firm connection between the LEDs and the heat dissipater so that transferring heat between the LEDs and the heat dissipater becomes difficult. Thus, heat dissipating efficiency of the LED light source assembly is in a low level.

Accordingly, what is needed, therefore, is an LED light source assembly which has an improved heat dissipation efficiency.

SUMMARY OF THE INVENTION

In accordance with a preferred embodiment, an LED based light source assembly comprises a circuit board, a plurality of LEDs, a heat sink and a plurality of fasteners. The circuit board comprises a first surface and a second surface opposite to the first surface. The first surface is provided with electrical conductive traces. The plurality of LEDs are arranged on the first surface of the circuit board and electrically connecting with the electrical wires of the circuit board. The heat sink thermally contacts the second surface of the circuit board. The plurality of fasteners each comprises a first end and a second end opposite to the first end. The first end of each of the fasteners abuts on the first surface of the circuit board. The second end of each of the fasteners extends through the circuit board to be secured to the heat sink.

Other advantages and novel features of the present invention will become more apparent from the following detailed description of preferred embodiment when taken in conjunction with the accompanying drawings, in which:

DETAILED DESCRIPTION OF THE EMBODIMENTS

Figure 1:
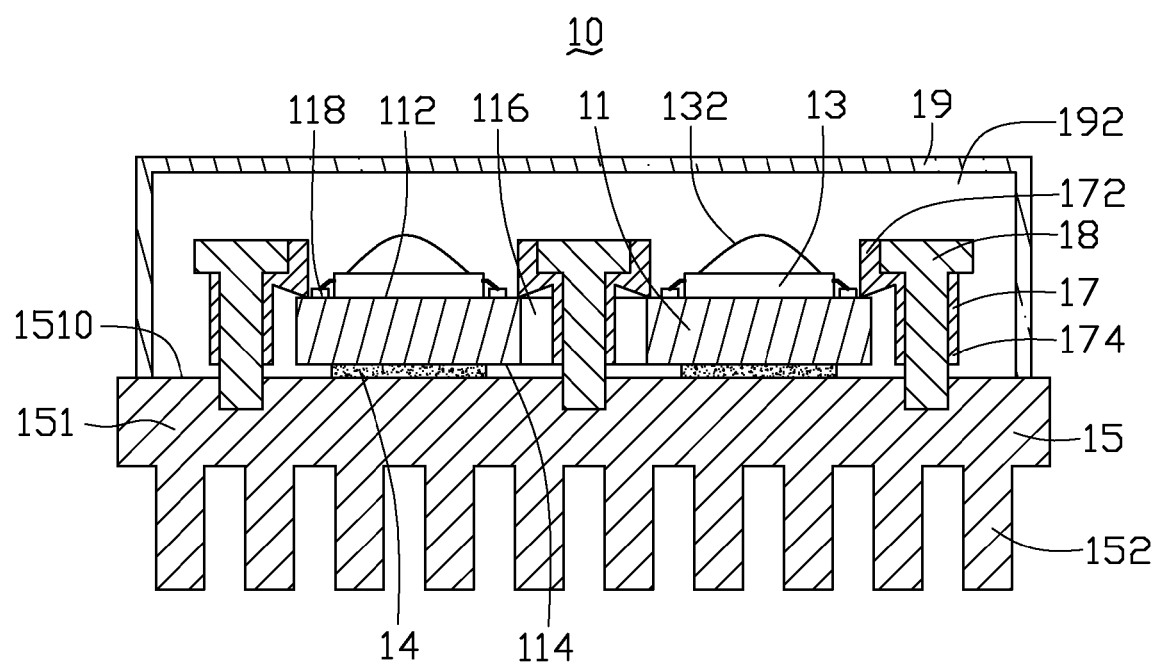
FIG. 1 is a cross-sectional view of an LED based light source assembly in accordance with a preferred embodiment of the present invention.

Referring to FIG. 1, an LED based light source assembly 10 in accordance with a preferred embodiment of the present invention is shown. The LED based light source assembly 10 comprises a circuit board 11, a plurality of LEDs 13 arranged on one side of the circuit board 11, a heat sink 15 arranged on another opposite side of the circuit board 11 for dissipating heat generated by the LEDs 13, and a plurality of fasteners 17 securing the circuit board 11 to the heat sink 15.

The circuit board 11 has a first surface 112 at a top side thereof, a second surface 114 at a bottom side thereof and a through hole 116. The first surface 112 is opposite to the second surface 114. The through hole 116 extends through the circuit board 11 from the first surface 112 to the second surface 114. The first surface 112 has a number of electrical conductive traces 118 formed therein, such as copper traces. Advantageously, the circuit board 11 can be a metal core printed circuit board (MCPCB) which has a high heat-transferring efficiency.

The LEDs 13 are secured on the first surface 112 of the circuit board 11 and electrically connect with the electrical conductive traces 118. FIG. 1 shows two LEDs 13, preferably, the two LEDs 13 are surface mounted type light emitting diode (SMT-type LED). Each of the LEDs 13 has one or more LED chips (not shown) capable of emitting light and a transparent package 132 covering the LED chip. An outer peripheral surface of the transparent package 132 serves as light emitting surface.

The heat sink 15 is arranged at a position adjacent to the second surface 114 of the circuit board 11. The heat sink 15 comprises a base 151 and a plurality of fins 152 extending downwardly from a bottom surface of the base 151 for increasing a heat dissipating area. The heat sink 15 can be made by copper or aluminium. The base 151 has a contacting surface 1510 at a top side which opposes to the second surface 114 of the circuit board 11 and is thermally connected with the second surface 114. For reducing a thermal resistance between the circuit board 11 and the base 15, a layer of thermal interface material, such as a thermal grease is preferably filled between the second surface 114 and the contacting surface 1510.

Figure 2A:
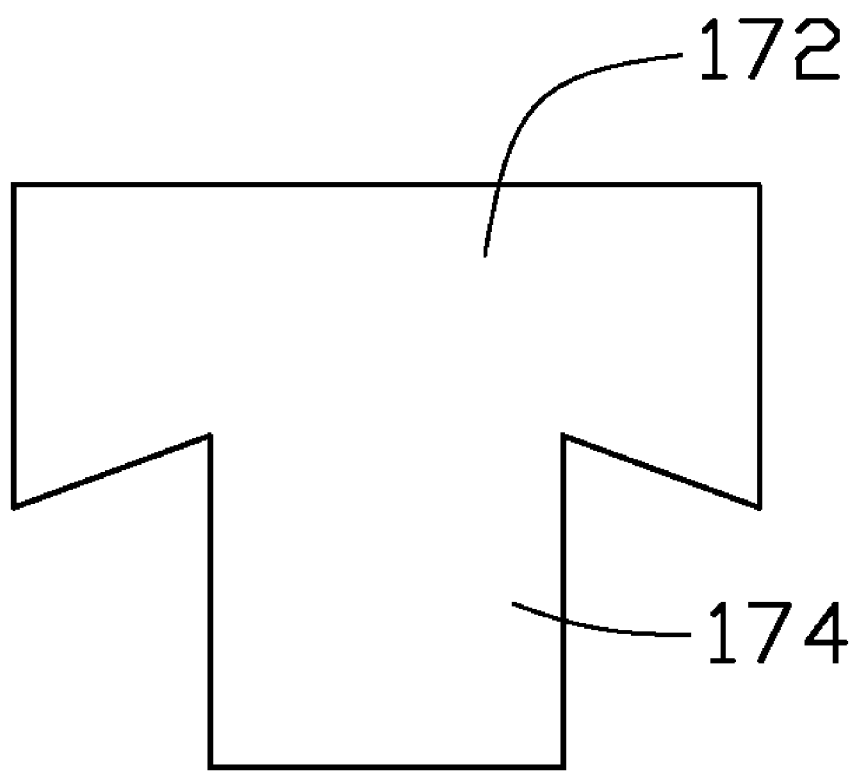
FIG. 2A is a front side view of a continuous-type fastener that can be used in the LED based light source assembly shown in FIG. 1.
Figure 2B:
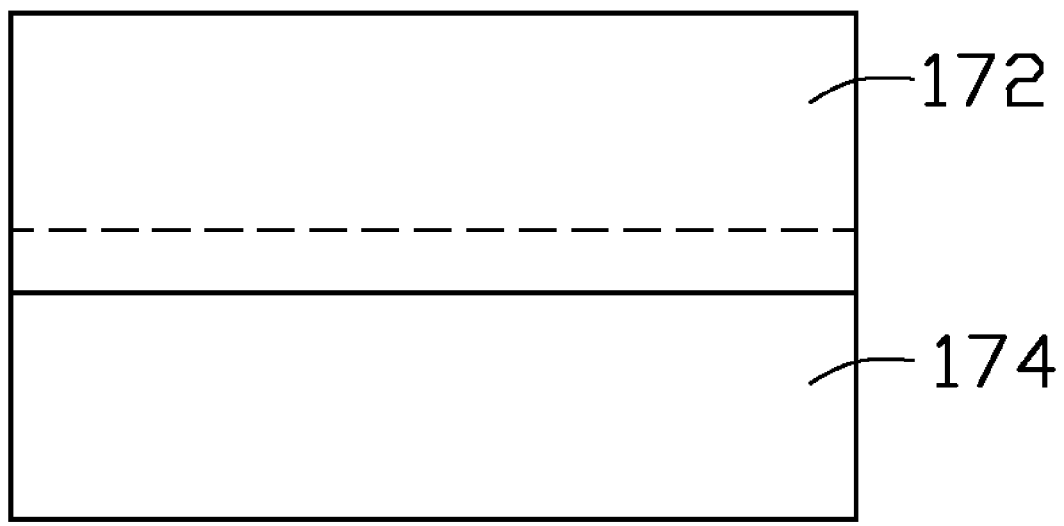
FIG. 2B is a left side view of the continuous-type fastener shown in FIG. 2A.
Figure 3A:
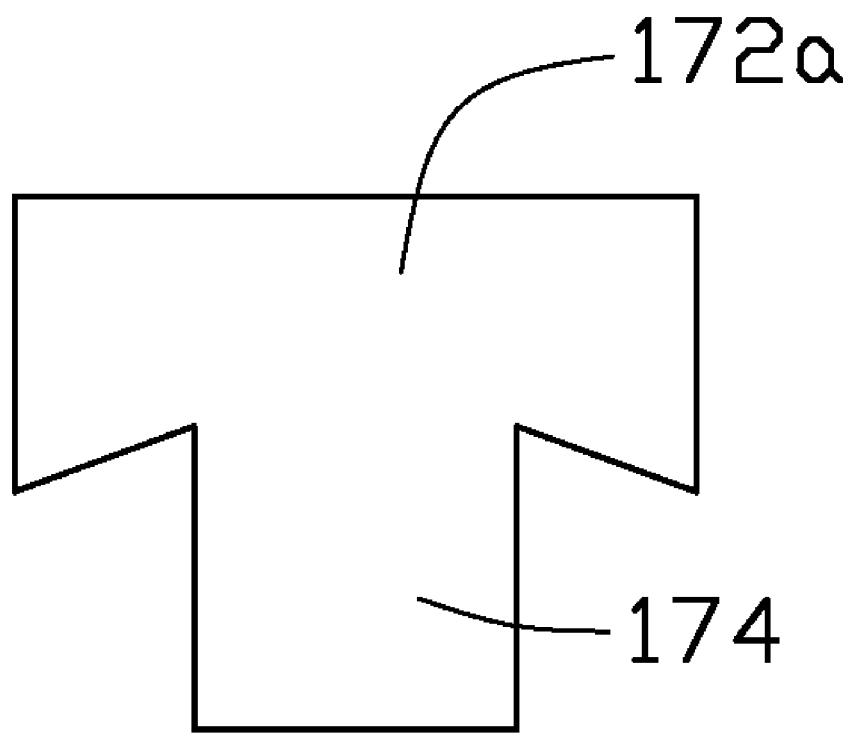
FIG. 3A is a front side view of a discontinuous-type fastener that can be used in the LED based light source assembly shown in FIG. 1.
Figure 3B:
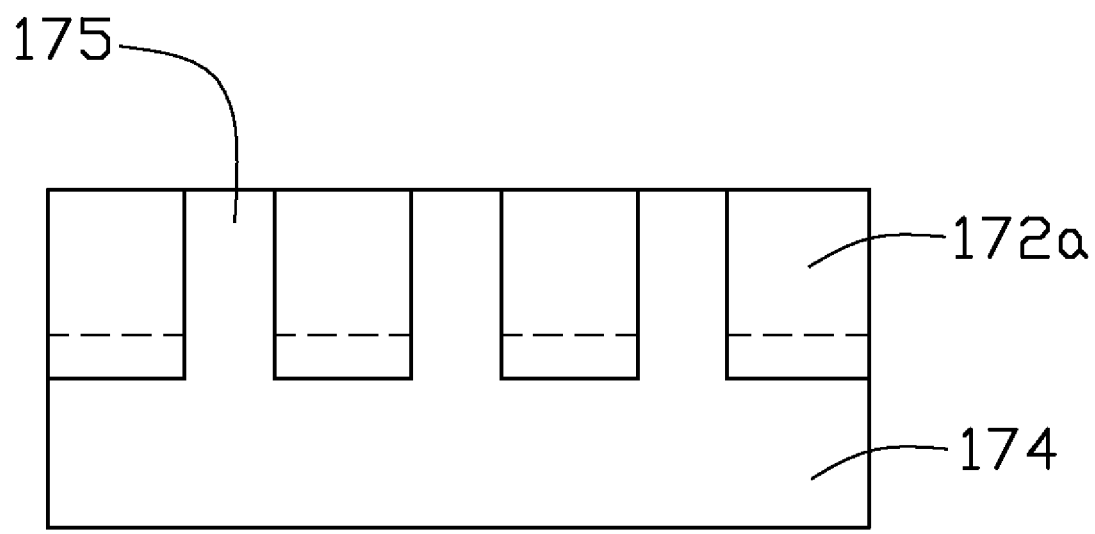
FIG. 3B is a left side view of the discontinuous-type fastener shown in FIG. 3A.

Also referring to FIG. 2A to FIG. 3B, each of the fasteners 17 comprises a first end 172 at an upside thereof and a second end 174 at a downside thereof. The first end 172 is opposite to the second end 174. Each fastener 17 has a screw-like shape with the first end 172 having a larger size than the second end 174. The fastener 17 can be in the form of a continuous-type fastener 17a as shown in FIG. 2A, FIG. 2B or in the form of a discontinuous-type fastener 17b as shown in FIG. 3A, FIG. 3B. In the continuous-type fastener 17a, the first end 172 has an even periphery. In the discontinuous-type fastener 17b, a plurality of evenly spaced grooves 175 are defined in the upside first end 172a. The first end 172 of the continuous-type fastener 17a abuts on the first surface 112 of the circuit board 11 and contacts the first surface 112 in a linearly continuous manner. The first end 172 of the discontinuous-type fastener 17b abuts on the first surface 112 of the circuit board 11 and contacts the first surface 112 in a linearly discontinuous manner. The second end 174 is secured to the heat sink 15 via a screw 18 threaded in the base 151 of the heat sink 15 so that the fasteners 17 can apply a downward force on the circuit board 11, to make the second surface 114 of the circuit board 11 into contact with the contacting surface 151 of the heat sink 15 in an intimate manner. Therefore, a heat-transferring efficiency between the circuit board 11 and the heat sink 15 is improved via the fasteners 17 which firmly secure the circuit board 11 into thermal contact with the heat sink 15.

The fasteners 17 can be made by a fiber reinforced plastic material, such as glass fiber reinforced plastic or carbon fiber reinforced plastic. The fiber reinforced plastic has many advantages, such as good fatigue durability, good elasticity for long-term use so that the fasteners 17 can keep a long-term pressure on the circuit board 11. The fiber reinforced plastic can be a material selected from a group consisting of polycarbonate, polyaceyal resin (POM), polypropylene, polyphthalamide (PPA), polybutylene terephthalate (PBT). Furthermore, the pressure on the circuit board 11 can be adjusted via the screw 18. The screws 18 each extend through the fasteners 17 from above to below. The fasteners 17 also serve as insulation As shown in FIG. 1, three fasteners 17 and the two LEDs 13 are arranged in an alternate fashion. Each of the LEDs 13 is located between two adjacent fasteners 17. Two of the three fasteners 17 are positioned at two lateral sides of the circuit board 11. The other one of the three fasteners 17 is positioned at a middle of the circuit board 11 via the second end 174 extending through the through hole 116 to thread into the heat sink 15. It is to be understood that the fasteners 17 can be limited to be arranged at the lateral sides of the circuit board 11 so that it is not necessary to define the through hole 116 in the circuit board 11. Correspondingly, the circuit board 11 can contact the heat sink 15 with a larger bottom surface.

The LED based light source assembly further comprises a light cover 19 which is secured to the contacting surface 1510 of the base 151. The light cover 19 cooperates with the heat sink 15 to define a receiving room 192. The circuit board 11, the LEDs 13 and the fasteners 17 are received in the receiving room 192.

Figure 4:
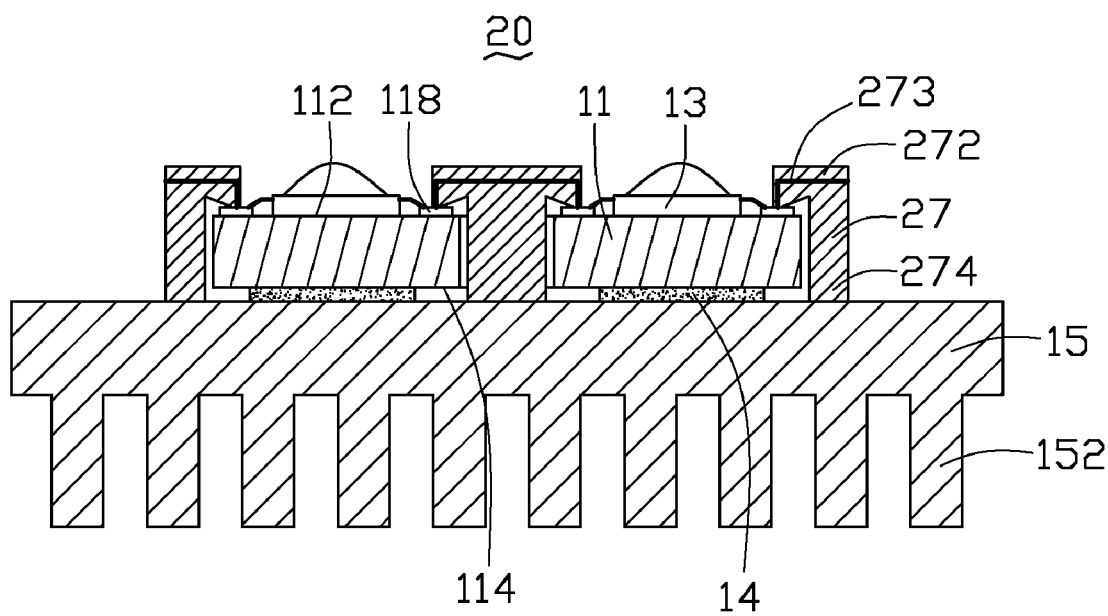
FIG. 4 is a cross-sectional view of an LED based light source assembly in accordance with a second embodiment of the present invention.

Referring to FIG. 4, an LED based light source assembly 20 in accordance with a second embodiment of the present invention is shown. The LED based light source assembly 20 has a similar configuration to the LED based light source assembly 10. The LED based light source assembly 20 comprises a circuit board 11, a plurality of LEDs 13, a heat sink 15 and a plurality of fasteners 27. The fasteners 27 and the LEDs 23 are arranged in an alternate fashion. Each of the LEDs 13 is located between two adjacent fasteners 27. Each of the fasteners 27 comprises a first end 272 and a second end 274 opposite to the first end 272. The difference between the LED based light source assembly 20 and the LED based light source assembly 10 is that the fastener 27 further comprises a wire 273 received in the first end 272 thereof. The first end 272 of the fastener 27 abuts on the first surface 112 of the circuit board 11 in a manner that the wire 273 electrically connects with the electrical conductive trace 118 that neighbors the wire 273. The second end 274 of the fastener 27 is secured to the heat sink 15 by conglutinating via adhesive. Thus, the fasteners 27 can apply a downward pressure on the circuit board 11 to make the second surface 114 of the circuit board 11 contact the contacting surface 151 of the heat sink 15 in an intimate manner. Therefore, a heat-transferring efficiency between the circuit board 11 and the heat sink 15 is improved via the fasteners 27. An external power supply (not shown) can provide electricity for all of the LEDs 13 on the circuit board 11 via the wire 273. It is to be understood that the second end 274 of the fastener 27 can be secured to the heat sink 15 in a similar manner as the fastener 17 does in the first preferred embodiment.

Figure 5:
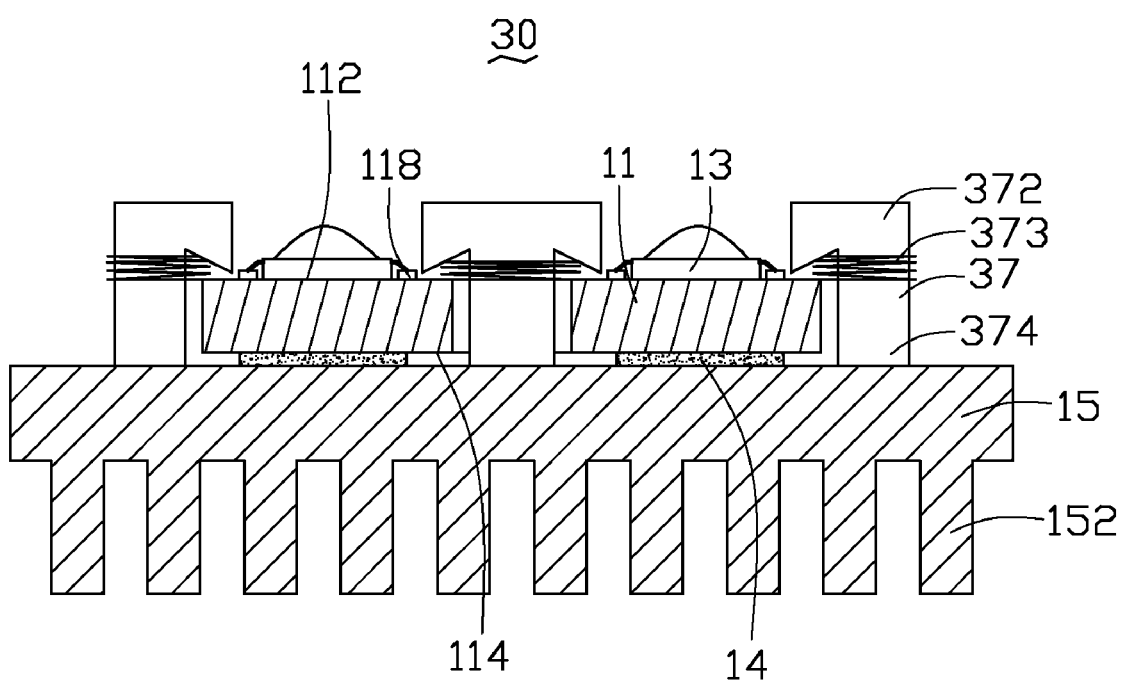
FIG. 5 is a cross-sectional view of an LED based light source assembly in accordance with a third embodiment of the present invention.

Referring to FIG. 5, an LED based light source assembly 30 in accordance with a third embodiment of the present invention is shown. The LED based light source assembly 30 has a similar configuration to the LED based light source assembly 10. The LED based light source assembly 20 comprises a circuit board 11, a plurality of LEDs 13, a heat sink 15 and a plurality of fasteners 37. Each of the fasteners 37 comprises a first end 372 and a second end 374 opposite to the first end 372. The difference between the LED based light source assembly 30 and the LED based light source assembly 10 is that the fastener 37 further comprises an elastic element 373, such as a spring, encircled around the fastener 37. The elastic element 373 is sandwiched between the first end 372 and the first surface 112 of the circuit board 11 in a manner that the first end 372 elastically abuts on the first surface 112 via the elastic element 373 to apply a downward pressure on the circuit board 11. The second end 374 of the fastener 37 is secured to the heat sink 15 by conglutinating via adhesive. Thus, the fasteners 37 can apply a downward pressure on the circuit board 11 to make the second surface 114 of the circuit board 11 contact the contacting surface 151 of the heat sink 15 in an intimate manner. Therefore, a heat-transferring efficiency between the circuit board 11 and the heat sink 15 is improved via the fasteners 37. It is to be understood that the second end 374 of the fastener 37 can be secured to the heat sink 15 in a similar manner as the fastener 17 does in the first preferred embodiment.

Figure 6:
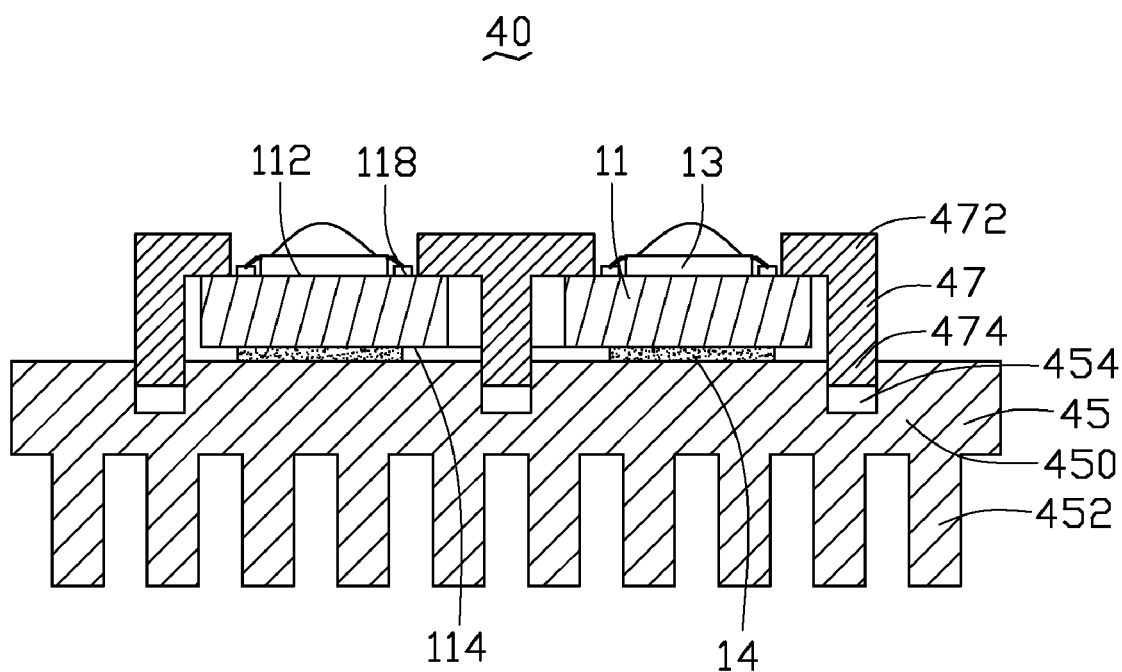
FIG. 6 is a cross-sectional view of an LED based light source assembly in accordance with a fourth embodiment of the present invention.

Referring to FIG. 6, an LED based light source assembly 40 in accordance with a fourth embodiment of the present invention is shown. The LED based light source assembly 40 has a similar configuration to the LED based light source assembly 10. The LED based light source assembly 40 comprises a circuit board 11, a plurality of LEDs 13, a heat sink 45 and a plurality of fasteners 47. Each of the fasteners 47 comprises a first end 472 and a second end 474 opposite to the first end 472. The heat sink 45 comprises a base 450 and a plurality of fins 452 extending downwardly from a bottom surface of the base 450. The difference between the LED based light source assembly 40 and the LED based light source assembly 10 is that the base 450 further comprises a plurality of grooves 454 defined in a top side adjacent to the second surface 114 of the circuit board 11. The first end 472 of the fastener 47 abuts on the first surface 112 of the circuit board 111 in a surface-contacting manner. A lower portion of the second end 474 of the fastener 47 is embedded in the groove 454 of the base 450 so that the fastener 47 can be firmly fixed in the base 450. Thus, the fasteners 47 can apply a downward pressure on the circuit board 11 to make the second surface 114 of the circuit board 11 contact the contacting surface 151 of the heat sink 15 in an intimate manner. Therefore, a heat-transferring efficiency between the circuit board 11 and the heat sink 15 is improved via the fasteners 47.

Figure 7:
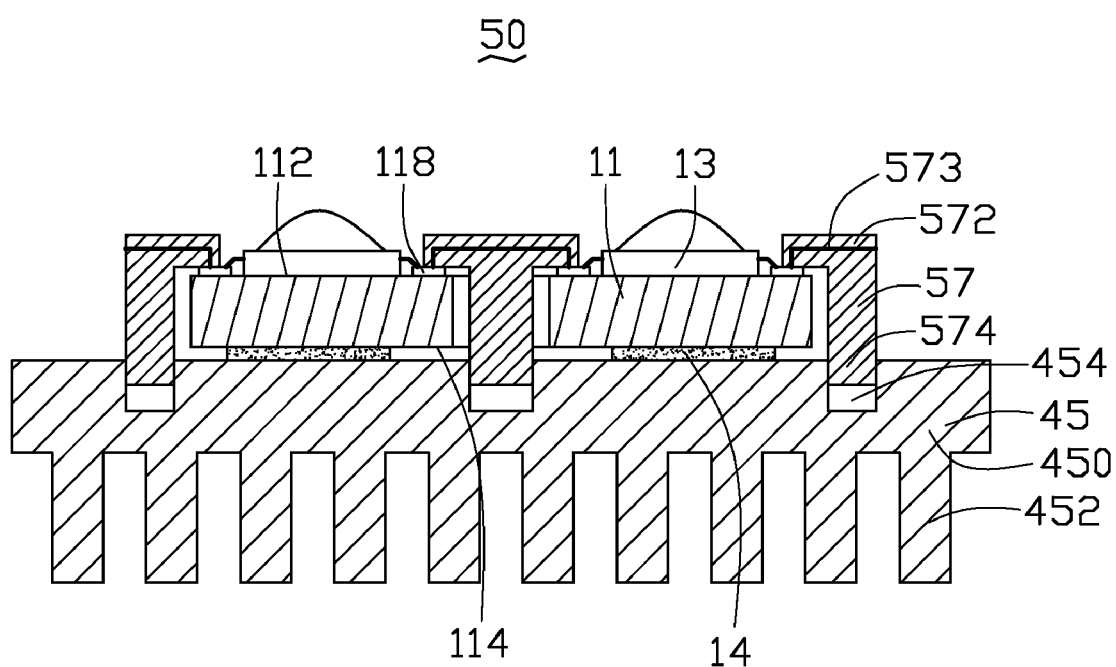
FIG. 7 is a cross-sectional view of an LED based light source assembly in accordance with a fifth embodiment of the present invention.

Referring to FIG. 7, a LED based light source assembly 50 in accordance with a fifth embodiment of the present invention is shown. The LED based light source assembly 50 has a similar configuration to the LED based light source assembly 40. The LED based light source assembly 50 comprises a circuit board 11, a plurality of LEDs 13, a heat sink 45 and a plurality of fasteners 57. Each of the fasteners 57 comprises a first end 572 and a second end 574 opposite to the first end 572. The second end 574 is firmly fixed in the base 450 of the heat sink 45 in a manner that the second end 574 is embedded in the groove 454 of the base 450. The difference between the LED based light source assembly 50 and the LED based light source assembly 40 is that the fastener 57 further comprises a wire 573 received in the first end 572. The first end 572 of the fastener 57 abuts on the first surface 112 of the circuit board 11 in a manner that the wire 573 electrically connects with the electrical conductive trace 118 that neighbors the wire 573. Thus, the fasteners 57 can apply a downward pressure on the circuit board 11 to make the second surface 114 of the circuit board 11 contact the contacting surface 151 of the heat sink 45 in an intimate manner. Therefore, a heat-transferring efficiency between the circuit board 11 and the heat sink 15 is improved via the fasteners 57. An external power supply (not shown) can provide electricity for all of the LEDs 13 on the circuit board 11 via the wire 573.

It is to be understood, however, that even though numerous characteristics and advantages of the present LED based light source assembly 10, 20, 30, 40, 50 have been set forth in the foregoing description, together with details of the structure and function of the preferred embodiments, the disclosure is illustrative only, and changes may be made in detail, especially in matters of shape, size of the fasteners 17, 27, 37, 47, 57, arrangement of the fasteners 17, 27, 37, 47, 57 and the LEDs 13, the connection between the fasteners 17, 27, 37, 47, 57 and the heat sink 15, 45, within the principles of the invention to the full extent indicated by the broad general meaning of the terms in which the appended claims are expressed.

What is claimed is:

1. An LED based light source assembly comprising:
a circuit board comprising a first surface and a second surface opposite to the first surface, and electrical conductive traces formed on the first surface;
a plurality of LEDs arranged on the first surface of the circuit board and electrically connecting with the electrical wires of the circuit board;
a heat sink thermally contacting the second surface of the circuit board; and
a plurality of fasteners each comprising a first end and a second end perpendicularly connected to the first end, wherein each of the fasteners comprises a metallic wire received in the first end and extending through the first end, the first end of each of the fasteners abuts on the first surface of the circuit board to make the metallic wires of the fasteners electrically connect with the electrical conductive traces of the circuit board, and the second end of each of the fasteners extends through the circuit board and is secured to the heat sink.

2. The LED based light source assembly as described in claim 1, wherein the circuit board comprises at least one through hole extending through the circuit board from the first surface to the second surface, and the second end of at least one of the fasteners extends through the at least one through hole.

3. The LED based light source assembly as described in claim 1, wherein the plurality of fasteners and the plurality of LEDs are arranged in an alternate fashion along the circuit board, and each of the LEDs is located between two adjacent fasteners.

4. The LED based light source assembly as described in claim 1, wherein the fasteners are secured to the heat sink by means of screwing.

5. The LED based light source assembly as described in claim 1, wherein the fasteners are secured to the heat sink by means of conglutinating.

6. The LED based light source assembly as described in claim 1, wherein the heat sink comprises a plurality of grooves defined in a side adjacent to the second surface of the circuit board, and the second ends of the fasteners are respectively embedded in the grooves of the heat sink so that the fasteners are firmly secured to the heat sink.

7. The LED based light source assembly as described in claim 1, wherein the first end of the fastener comprises a compressed spring element abutting against the first surface of the circuit board.

8. The LED based light source assembly as described in claim 1, wherein the fasteners are made by a fiber reinforced plastic material.

9. The LED based light source assembly as described in claim 8, wherein the fiber reinforced plastic material is glass fiber reinforced plastic or carbon fiber reinforced plastic.

10. The LED based light source assembly as described in claim 1, wherein the first end of each of the fasteners are in linear contact with the first surface of the circuit board.

11. The LED based light source assembly as described in claim 1, wherein a thermal interface material is applied between the second surface of the circuit board and a contacting surface of the heat sink facing the second surface of the circuit board.

12. The LED based light source assembly as described in claim 1, further comprising a cover, which cooperates with the heat sink to define a receiving room, and the circuit board, the LEDs and the fasteners are received in the receiving room.

13. The LED based light source assembly as described in claim 1, wherein each fastener has a screw-like shape with the first end having a larger size than the second end.

14. An LED based light source assembly comprising:
a circuit board comprising a first surface at a top side and a second surface at a bottom side, and electrical conductive traces formed on the first surface;
a plurality of LEDs arranged on the first surface of the circuit board and electrically connecting with the electrical conductive traces of the circuit board;
a heat sink arranged beneath the circuit board and thermally contacting the second surface of the circuit board; and
a plurality of fasteners each comprising a first end at an upside and a second end at a downside, wherein
each of the fasteners comprises a metallic wire received in the first end and extending through the first end, the fasteners connect the circuit board with the heat sink in an intimate manner with the first end of each of the fasteners abutting on the first surface of the circuit board to make the metallic wires of the fasteners electrically connect with the electrical conductive traces of the circuit board and the second end of each of the fasteners extending through the circuit board to be secured to the heat sink, at least one of the fasteners is positioned at a lateral side of the circuit board and at least another one of the fasteners is positioned at a middle of the circuit board.

15. The LED based light source assembly as described in claim 14, wherein the circuit board comprises at least one through hole extending through the circuit board from the first surface to the second surface, and the second end of the at least another one of the fasteners extends through the at least one through hole to be secured to the heat sink.

16. The LED based light source assembly as described in claim 14, wherein the heat sink defines a plurality of grooves corresponding to the fasteners, and the second ends of the fasteners are secured to the heat sink by screwing into or embedding in the grooves.

17. The LED based light source assembly as described in claim 14, wherein the fasteners are secured to the heat sink by conglutinating.

18. The LED based light source assembly as described in claim 14, wherein the first end of the fastener comprises a compressed spring member abutting against the first surface of the circuit board.

19. The LED based light source assembly as described in claim 14, wherein an elastic element is encircled around each fastener and elastically sandwiched between the first end and the first surface of the circuit board.

* * * * *